United States Patent [19]

Nishitani et al.

[11] Patent Number: 5,725,671
[45] Date of Patent: Mar. 10, 1998

[54] APPARATUS FOR MANUFACTURING CHALCOPYRITE FILM

[75] Inventors: Mikihiko Nishitani, Nara; Takayuki Negami, Katano; Takahiro Wada, Hirakata, all of Japan

[73] Assignee: Matsushita Electric Industrial Co., Ltd., Kadoma, Japan

[21] Appl. No.: 795,289

[22] Filed: Feb. 4, 1997

Related U.S. Application Data

[62] Division of Ser. No. 420,183, Apr. 11, 1995, Pat. No. 5,633,033.

[30] Foreign Application Priority Data

Apr. 18, 1994 [JP] Japan .................................. 6-078720

[51] Int. Cl.[6] .................................... C23O 16/00
[52] U.S. Cl. .................. 118/665; 118/710; 118/712; 118/715
[58] Field of Search .................. 118/665, 710, 118/712, 715

[56] References Cited

U.S. PATENT DOCUMENTS

| | | |
|---|---|---|
| 4,335,266 | 6/1982 | Mickelsen et al. . |
| 4,543,576 | 9/1985 | Hieber et al. . |
| 4,783,373 | 11/1988 | Baumeister et al. . |
| 5,151,295 | 9/1992 | Kawahara et al. . |
| 5,200,021 | 4/1993 | Kawai et al. . |
| 5,241,366 | 8/1993 | Bevis et al. . |
| 5,260,772 | 11/1993 | Pollak et al. . |
| 5,403,433 | 4/1995 | Morrison et al. . |

FOREIGN PATENT DOCUMENTS

| | | |
|---|---|---|
| 4-280417 | 10/1992 | Japan . |
| 5-26624 | 2/1993 | Japan . |
| 5-145100 | 6/1993 | Japan . |

OTHER PUBLICATIONS

R.A. Mickelsen et al.; "Development of Thin–Film $CuInSe_2$ Solar Cells", *ICTMC7*; High Technology Center; 1986, pp. 39–47.

*Primary Examiner*—Richard Bueker
*Attorney, Agent, or Firm*—Panitch Schwarze Jacobs & Nadel, PC

[57] ABSTRACT

An apparatus for manufacturing an $ABC_2$ chalcopyrite film (wherein A represents Cu or Ag, B represents In, Ga or Al, C represents S, Se or Te) includes a substrate holder, a substrate heater, a supply source for supplying elements A, B or C onto the substrate and for controlling the supply process, and a monitor for monitoring an electrical or optical property of the thin film layer deposited on the substrate. The electrical or optical property of the thin film layer abruptly changes at a first time point when the A/B ratio in the thin film layer changes from an element A-excessive state to the stoichiometric composition ratio of the $ABC_2$. The electrical or optical property of the thin film layer demonstrates a stable value at a second time point when the A/B ratio becomes an element-B excessive state. Deposition is terminated at the second time point.

7 Claims, 11 Drawing Sheets

APPARATUS FOR MANUFACTURING CHALCOPYRITE FILM

This is a division of application Ser. No. 08/420,183 filed Apr. 11, 1995, U.S. Pat. No. 5,633,033.

BACKGROUND OF THE INVENTION

1. Field of the Invention

The present invention generally relates to the production of chalcopyrite compounds. In particular, it is concerned with an apparatus and a method for manufacturing an $ABC_2$ chalcopyrite film having a wide application in the field of photovoltaic devices such as thin film-type solar cells.

2. Description of the Prior Art

In a polycrystalline thin film of the $ABC_2$ chalcopyrite (wherein A represents Cu or Ag, B represents In, Ga or Al and C represents S, Se or Te), a thin film containing element A in excess has large crystal grains and is excellent in crystallinity of the crystal grains. Components of $A_2C$, for instance, $Cu_2Se$, $Cu_2S$ and the like, however, are deposited on the boundary between the respective crystal grains or on the surface thereof, and thus, the thin film as it is cannot be applied to a device. An electrical characteristic of this thin film demonstrates a p-type conduction and its electric conductivity at room temperature is about 100 $\Omega^{-1}$ $cm^{-1}$. As mentioned above, although the thin film containing element A in excess is a polycrystalline thin film having an excellent crystallinity, it suffers a disadvantage that it holds an impurity phase on its boundary between the respective crystal grains or on its surface.

In spite of the above-mentioned disadvantage, it is reported that an excellent thin film available for the solar cells is formed based on such thin film (for instance, Proceedings of the 16th IEEE Photovoltaic Specialist Conference (1982), p.781). The disclosed manufacturing method is generally called "bilayer process". A scheme of this technology is shown in FIG. 10 and FIG. 11. The apparatus employed in the disclosed bilayer process comprises a vapor deposition apparatus including a vacuum chamber which accommodates cells 10, 11, and 12 each for supplying a flux of each of the elements A, B and C to a substrate 1, wherein the supplying amounts of the respective fluxes are controlled by the temperature of the respective cells. The substrate 1 is mounted on a substrate holder 4 and usually heated at 350° C. or above.

The bilayer process using the apparatus shown in FIG. 10 proceeds in the following manner.

As shown in FIG. 11, by adjusting the amounts of the fluxes of the respective elements, an $ABC_2$ chalcopyrite thin film layer 2 of a composition containing element A in excess is first produced (see, FIG. 11A). Subsequently, a second layer is deposited on the first produced layer by further elevating the temperature of the substrate by about 100° C., and adjusting the amounts of the fluxes of the respective elements to the conditions under which an $ABC_2$ chalcopyrite thin film layer of a composition containing element B in excess is produced (see, FIG. 11B). In this case, if the temperature of the substrate is sufficiently high, a thin film 2b in an intermediate state is converted into an $ABC_2$ chalcopyrite thin film 3 of a homogeneous composition being approximate to a stoichiometric composition but containing element B in slight excess (see, FIG. 11C). The thin film layer produced in the above-mentioned manner has the large crystal grains and is free from the deposition of the impurity phase on the boundary between the respective crystal grains and on the surface, and thus becomes a thin film layer which can preferably be applied to the photovoltaic devices. The undesirable deposition of the impurity phase has frequently been observed with the $ABC_2$ chalcopyrite of the composition containing element A in excess.

In order to produce a solar cell having a higher conversion efficiency, it is required to adjust a composition ratio of A/B at about 0.95–1.0 by accurately controlling the ratio. Although the above-mentioned bilayer process is one of the methods for producing an excellent $ABC_2$ chalcopyrite thin film layer capable of being applied to the photovoltaic devices such as solar cells, it is difficult to realize an adequate composition ratio of A/B in a good reproducibility. The reason for this is that even if a condition for making the composition ratio of A/B is once established experimentally, the amounts of the fluxes of the respective elements sensitively reflect a difference in the degree of vacuum inside the vacuum chamber, a difference in the species of the gas remaining in the vacuum chamber and a delicate difference in the substrate temperature. Further, in this bilayer process, it is required to realize the following two conditions: one for producing an $ABC_2$ thin film layer containing an excessive amount of element A and the other for producing an $ABC_2$ thin film layer containing an excessive amount of element B, at the same time, by adjusting the amounts of the fluxes of the elements A and B. Therefore, this bilayer process has a disadvantage that it takes much time and labor for establishing these conditions that results in a poor throughput of the whole system.

SUMMARY OF THE INVENTION

It is an object of the present invention to provide a method for manufacturing an $ABC_2$ chalcopyrite thin film layer capable of being applied to the photovoltaic devices such as solar cells and the like, and having a highly favorable reproducibility.

Another object of the present invention is to provide an apparatus for manufacturing such an $ABC_2$ chalcopyrite thin film layer efficiently.

In order to attain these and other desirable objects, the present invention provides a method for manufacturing an $ABC_2$ chalcopyrite thin film layer comprising the steps of:

- a first step of forming a thin film layer containing element A, element B and element C on a substrate, wherein the content of element A exceeds the stoichiometric composition ratio of $ABC_2$,
- a second step of exposing the thin film layer formed in the first step to a flux or gas containing element B and element C, or to a gas or flux containing element A, element B and element C but containing element B in excess, and
- a monitoring step of monitoring a particular physical property of the thin film layer in order to determine an end point of the second step where the physical property of the thin film layer demonstrates a specific change.

That is, the present invention is based on a finding that the particular physical property of the above-mentioned thin film layer specifically changes at a first time point where a ratio A/B of element A to element B in the composition of the above-mentioned thin film layer changes from an element A-excessive state to a composition of the stoichiometric ratio represented by the formula $ABC_2$, and demonstrates a stable value at a second time point where the composition becomes an element B-excessive state, and that $ABC_2$ chalcopyrite thin film layer of a high quality can be obtained by terminating the above-mentioned second step at the second time point.

The present invention utilizes, as the above-mentioned particular physical property, at least one physical property selected from the group consisting of an electric resistance of the above-mentioned thin film layer, the intensity of light reflected by or transmitted through the thin film layer.

The present invention provides a method for manufacturing $ABC_2$ chalcopyrite thin film layer comprising the steps of:

(1) a first step of forming a thin film layer containing element A, element B and element C on a substrate, wherein the content of element A exceeds the stoichiometric composition ratio of $ABC_2$, (2) a second step of exposing the thin film layer formed in the first step to a flux or gas containing element B and element C, or to a gas or flux containing element A, element B and element C but containing element B in excess, and (3) a monitoring step of monitoring a physical property of the thin film layer which changes in correspondence with the change in the A/B ratio of element A to element B in the thin film layer, wherein the physical property of the thin film layer specifically changes at a first time point when the A/B ratio in the thin film layer changes from an element A-excessive state to the stoichiometric composition ratio of the $ABC_2$, and demonstrates a stable value at a second time point when the A/B ratio becomes an element B-excessive state after a lapse of a substantial time period, and wherein the second step is terminated at the second time point.

In the above-mentioned method, A represents Cu or Ag, B represents In, Ga or Al, and C represents S, Se or Te.

In a mode of the step for monitoring the physical property of the above-mentioned thin film layer, the monitoring step comprises monitoring a current flowing through a load resistor electrically connected to the thin film layer at the time of irradiating the thin film layer with an electron beam. In this mode, the current flowing through the load resistor abruptly decreases at a first time point when the A/B ratio in the thin film layer changes from an element A-excessive state to the stoichiometric composition ratio of the $ABC_2$, and reaches a stable value at a second time point when the A/B ratio becomes B-excessive state, and the second step is terminated at the second time point.

In another mode of the present invention, the above-mentioned step comprises monitoring the intensity of light reflected from the surface of the thin film layer by a light detecting system when the above-mentioned thin film layer is irradiated with light, in order to determine the end point of the above-mentioned second step. In this mode, the intensity of reflected light from the thin film layer decreases at a first time point when the A/B ratio changes from an element A-excessive state to the stoichiometric composition ratio of the $ABC_2$, and reaches a stable value at a second time point when the A/B ratio becomes B-excessive state, and the second step is terminated at the second time point.

In a still further mode of the present invention, the monitoring step comprises monitoring the intensity of the infrared ray transmitted through the thin film layer by a light detecting system when the thin film layer is irradiated with the infrared ray, in order to determine the end point of the above-mentioned second step. In this mode, the intensity of transmitted infrared ray decreases and thereafter increases at a first time point when the A/B ratio changes from an element A-excessive state to the stoichiometric composition ratio of the $ABC_2$, and reaches a stable value at a second time point when the A/B ratio becomes an element B-excessive state, and the second step is terminated at the second time point.

The present invention also provides an apparatus for manufacturing an $ABC_2$ chalcopyrite thin film layer (wherein A represents Cu or Ag, B represents In, Ga or Al, C represents S, Se or Te) comprising:

a substrate holder, means provided on the substrate holder for heating the substrate, a plurality of element supplying means each for supplying element A, element B or element C onto the substrate and for controlling the supplying operations of the respective elements, and monitoring means for monitoring a physical property of the thin film layer deposited on the substrate, wherein the physical property of the thin film layer specifically changes at a first time point when the A/B ratio in the thin film layer changes from an element A-excessive state to the stoichiometric composition ratio of the $ABC_2$, and demonstrates a stable value at a second time point when the A/B ratio becomes an element B-excessive state, wherein the monitoring is performed in order to determine an end point of depositing the thin film layer where the physical property demonstrates a stable value, by controlling the element supplying operation of the element supplying means.

While the novel features of the present invention are set fourth particularly in the appended claims, the invention, both as to organization and content, will be better understood and appreciated, along with other objects and features thereof, from the following detailed description taken in conjunction with the appended drawings.

Figure 1:
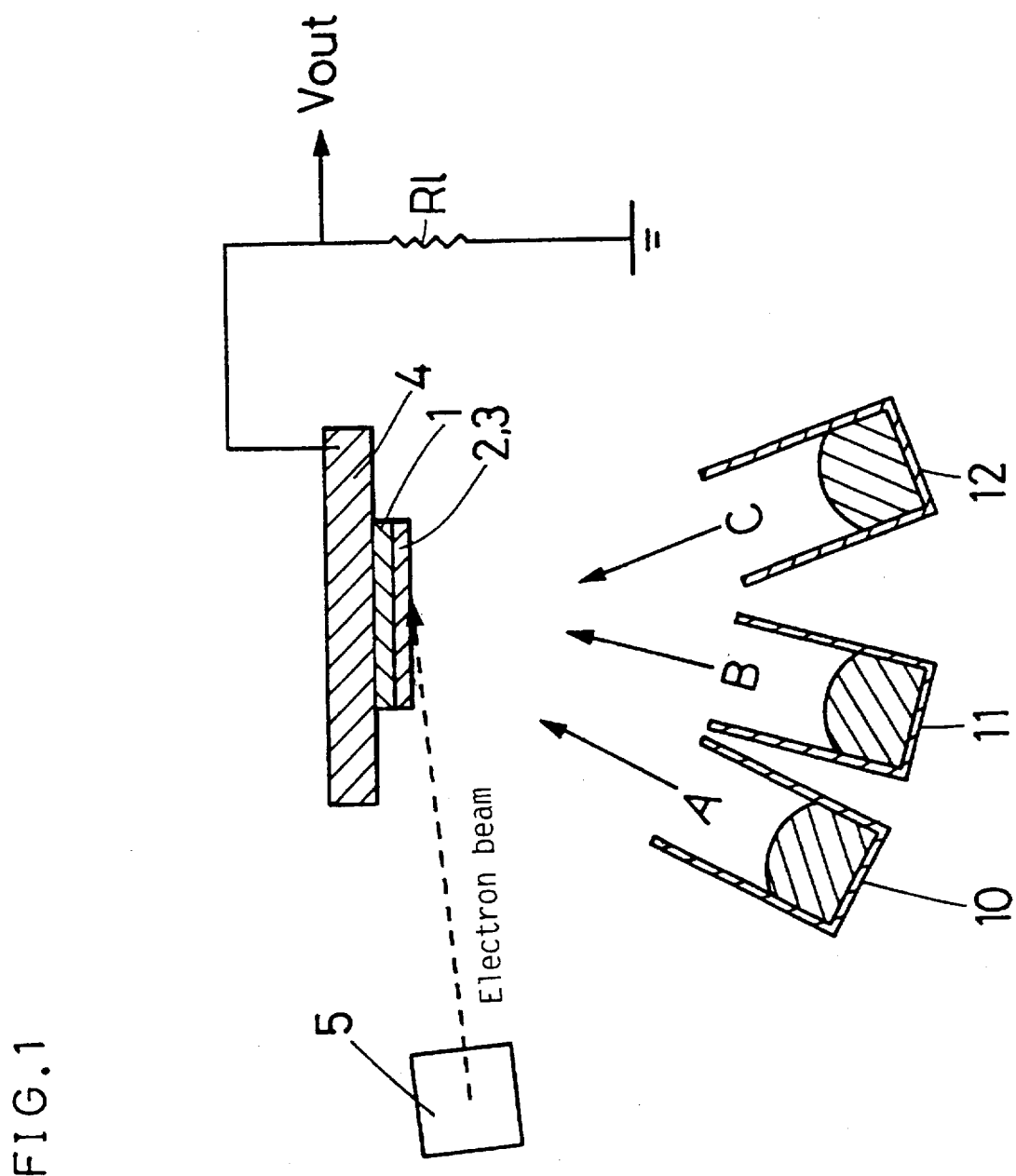
FIG. 1 is a longitudinal cross-sectional view schematically showing an apparatus for manufacturing a chalcopyrite thin film in accordance with one embodiment of the present invention.

It will be recognized that some or all of the Figures are schematic representations for purposes of illustration and do not necessarily depict the actual relative sizes or locations of the elements shown.

DETAILED DESCRIPTION OF THE PREFERRED EMBODIMENTS

In the following paragraphs, the present invention will be described in more detail by referring to its preferred embodiments.

The present invention can effectively embodied in the following two methods for manufacturing the $ABC_2$ chalcopyrite thin film layer. One of them is the method for manufacturing the $ABC_2$ chalcopyrite thin film layer, which is already established in the prior technology and described as the bilayer process. The other is a manufacturing method which utilizes a phenomenon that if only element B and element C are continuously supplied to the $ABC_2$ chalcopyrite thin film layer of an element A-excessive composition under a condition of a sufficiently high substrate temperature, the composition of the thin film layer becomes one that approximates to a stoichiometric composition ratio with a lapse of time, and if the supply of element B and element C is further continued, the composition gradually changes to an $ABC_2$ chalcopyrite thin film layer of an element B-excessive composition.

According to the present invention, it is possible to improve the throughput of the production process and its reproducibility because adjustment of the supplying amount of each of element A or element B can be dispensed with during the thin film layer production process. More concretely, in producing the $ABC_2$ chalcopyrite thin film layer in accordance with the previously-described method, a detection is made on a phenomenon that an electric resistance of the thin film layer is increasing with the change in its composition (particularly, A/B ratio) successively even in a state of a high substrate temperature, by irradiating the surface of the thin film layer with an electron beam during its depositing operation and monitoring the change in the current which is lead to an outside circuit. And thus, an end point of the film production is determined by monitoring the change in the current flow which reflects the change in the electric resistance and grasping the completion of the increase in the electric resistance. As a result, it is possible to improve the film composition, in other words, the reproducibility of the film quality in particular, not to mentioned of the improvement in the throughput of the production process.

With the progress of the increase in the electric resistance of the thin film layer, an optical property of the thin film layer also changes in a manner such that, for instance, its reflectance of an infrared ray decreases, whereas its transmittance of the infrared ray increases, accordingly. Therefore, it is possible to obtain a signal corresponding to the composition (A/B ratio) of the thin film layer by monitoring the intensity of the infrared ray reflected from or transmitted through the thin film layer, and to determine the end point of the film production where the respective signals change and thereafter demonstrate stability.

According to the present invention, it is possible to perform a real-time monitoring of the composition of the $ABC_2$ chalcopyrite thin film layer, and to manufacture the thin film layer always having the optimum composition of the $ABC_2$ chalcopyrite thin film layer with a favorable reproducibility.

According to the present invention, it is also possible to manufacture the $ABC_2$ chalcopyrite thin film layer having a high quality and a wide application in photovoltaic devices such as solar cells and the like with a favorable reproducibility.

In the following paragraphs, the present invention will be illustrated in more detail by way of concrete examples with reference to the attached drawings.

EXAMPLE 1

FIG. 1 shows a schematic configuration of an apparatus for manufacturing the $ABC_2$ chalcopyrite thin film layer built in accordance with the present invention. The manufacturing process employing the apparatus is performed in the following manner.

First, by controlling the temperatures inside the respective cells 10, 11 and 12, the amounts of the fluxes of the respective elements A, B and C were adjusted. Then, an $ABC_2$ thin film layer 2 of the element A-excessive composition was prepared under a condition capable of depositing the $ABC_2$ thin film layer of the element A-excessive composition. In this example, although a glass substrate coated with Mo was used as the substrate 1, the present invention is not necessarily limited to this. The temperature of the substrate is required to be at 400° C. or above and is preferably from 500° C. to 550° C. If the temperature of the substrate is too low, growth of the crystal grains cannot proceed suitably. In contrast, if the temperature of the substrate is too high, an inconvenience of re-evaporation of the supplied element may be yielded.

Subsequently, depositing the film layer on the substrate was continued by performing a supply of element A, element B and element C adjusted to the element B-excessive composition, or by performing a supply of only element B and element C while stopping the supply of element A. If the temperature of the substrate was sufficiently high, it was possible to prepare an $ABC_2$ chalcopyrite thin film layer 3 having a homogeneous composition which approximated to the stoichiometric composition ratio of the $ABC_2$ but contained element B in slight excess. In this case, an electric resistance of the film became high abruptly in the film composition (A/B ratio) being in the vicinity of the stoichiometric composition ratio and demonstrated stability in the $ABC_2$ chalcopyrite thin film containing excessive element B.

In the apparatus shown in FIG. 1, there is provided an electron gun 5 as a means for supplying an electron beam to the substrate 1 mounted on an electrically conductive substrate holder 4 which is electrically insulated from the ground potential. The output voltage $V_{out}$ across the load resistor $R_1$ during the process of depositing the film was monitored and a change in the output voltage for the lapse of time as shown by the diagram in FIG. 2 was observed. A point W in this diagram represents a time point when the supply of the flux is switched from the condition of depositing the element A-excessive film to the element B-excessive condition or when the supply of element A is stopped. A point X in the diagram represents a time point of from 5 to 15 minutes after the abrupt change in the output voltage. The change in the composition of A/B ratio reflects a moderate change to the film of element B-excessive composition.

Figure 2:
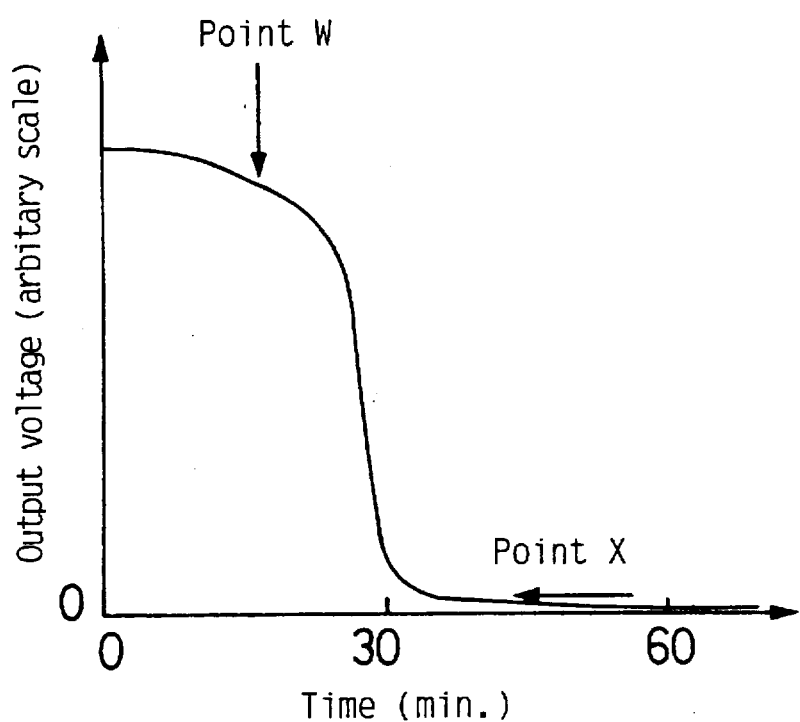
FIG. 2 is a diagram showing the changes in the output voltage in the manufacturing apparatus shown in FIG. 1.

The ABC$_2$ chalcopyrite thin film layer (wherein A=Cu, B=In, C=Se) thus obtained under a condition corresponding to the point X of the diagram in FIG. 2 had an almost homogeneous composition in its entirety and was a film having the following composition: 24–25 atomic % for element A, 25–25.5 atomic % for element B and 50–50.5 atomic % for element C.

As described above, according to the apparatus having the monitoring means in accordance with the present invention, it is possible to produce the ABC$_2$ chalcopyrite (wherein, A represents Cu or Ag, B represents In, Ga or Al, C represents S, Se or Te) thin film layer 3 having an excellent quality which is most suitable for the photovoltaic devices such as solar cells and the like in a simple operation with a good reproducibility.

EXAMPLE 2

Figure 3:
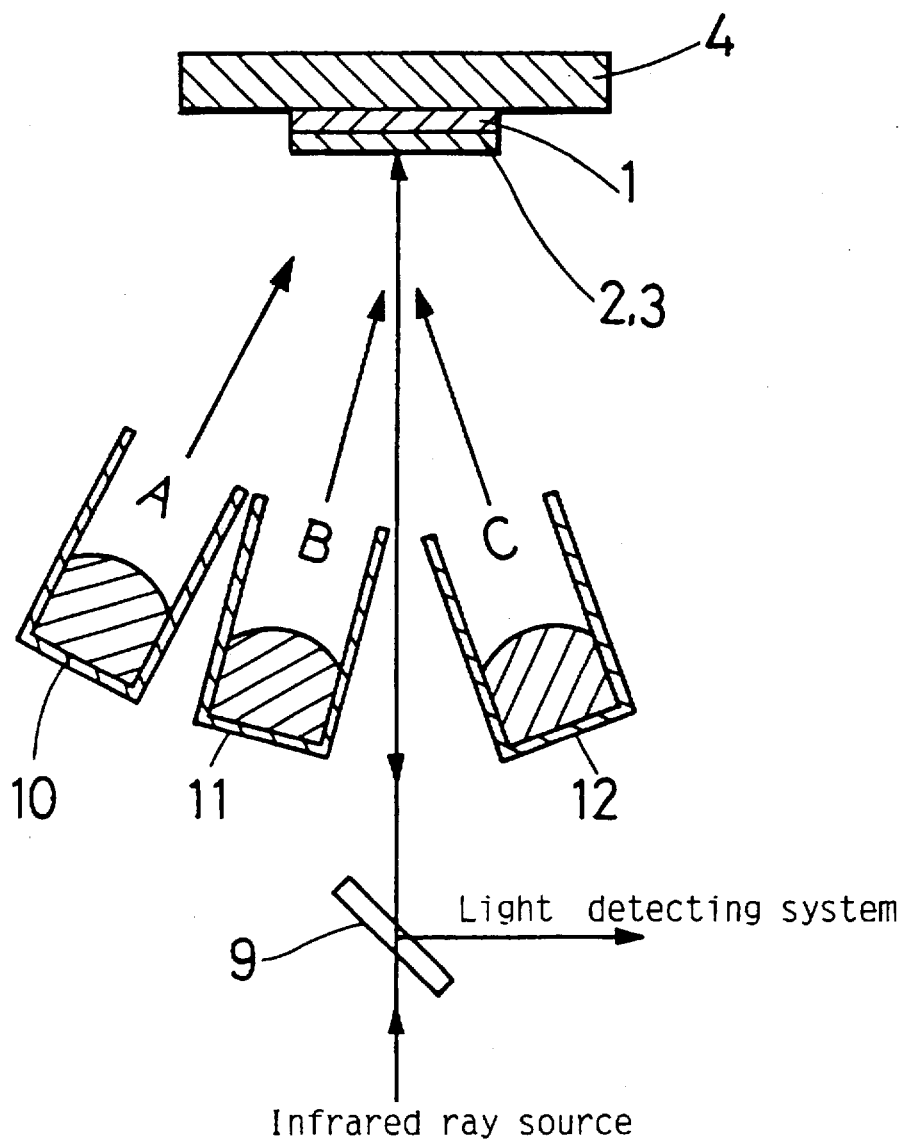
FIG. 3 is a longitudinal cross-sectional view schematically showing an apparatus for manufacturing a chalcopyrite thin film in accordance with another embodiment of the present invention.
Figure 4:
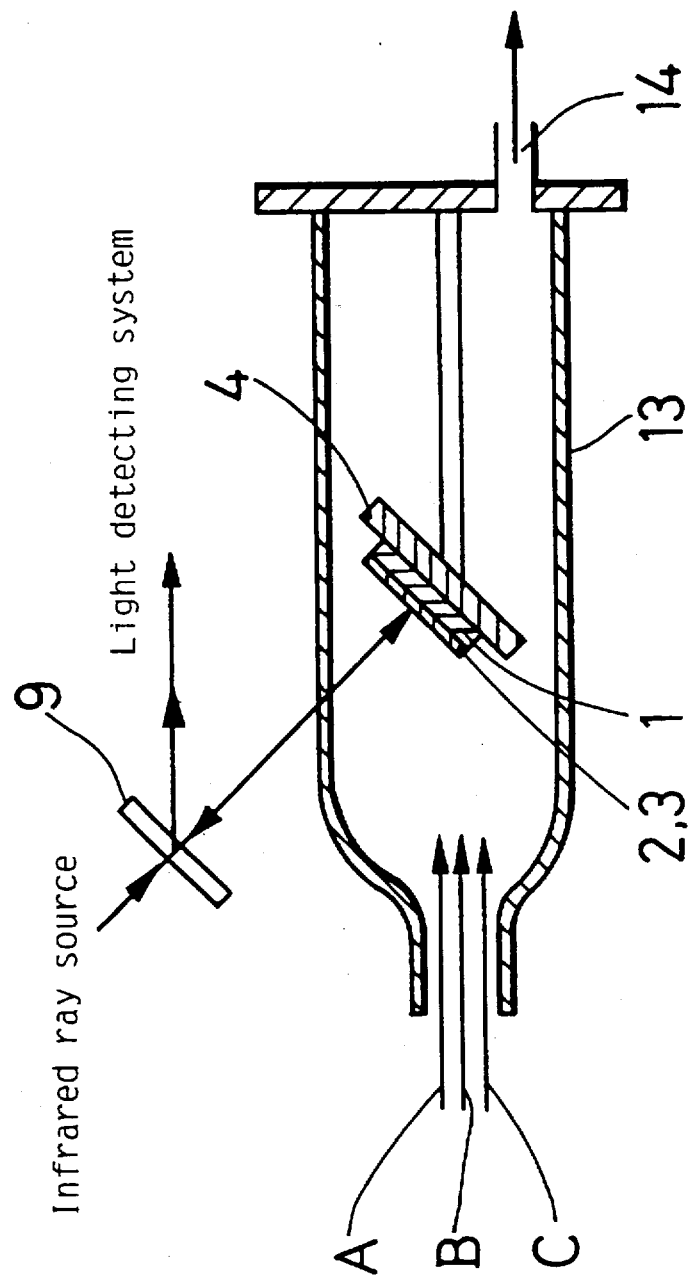
FIG. 4 is a longitudinal cross-sectional view schematically showing an apparatus for manufacturing a chalcopyrite thin film in accordance with a still other embodiment of the present invention.

FIG. 3 and FIG. 4 show a schematic configuration of an apparatus for manufacturing the ABC$_2$ chalcopyrite thin film layer built in accordance with this example. The manufacturing process employing the apparatus is performed in the following manner.

First, by controlling the temperatures inside the respective cells 10, 11 and 12, the amounts of the fluxes (gases) of the respective elements A, B and C were adjusted. Then, an ABC$_2$ thin film layer 2 of the element A-excessive composition was prepared under a condition capable of depositing the ABC$_2$ thin film layer of the element A-excessive composition. In this example, although a glass substrate coated with Mo was used as the substrate 1, the present invention is not necessarily limited to this. The temperature of the substrate is required to be at 400° C. or above and is preferably from 500° C. to 550° C. If the temperature of the substrate is too low, growth of the crystal grains cannot proceed suitably. In contrast, if the temperature of the substrate is too high, an inconvenience of re-evaporation of the supplied element may be yielded.

Subsequently, depositing the film layer on the substrate was continued by performing a concurrent supply of element A, element B and element C adjusted to the element B-excessive composition, or by performing a supply of only element B and element C while stopping the supply of element A. If the temperature of the substrate was sufficiently high, it was possible to prepare an ABC$_2$ chalcopyrite thin film 3 having a homogeneous composition which approximated to the stoichiometric composition of the ABC$_2$ but contained element B in slight excess. In this case, an electric resistance of the film became high abruptly in the film composition (A/B ratio) being in the vicinity of the stoichiometric composition ratio and demonstrated stability in the ABC$_2$ chalcopyrite thin film having the excessive element B.

The apparatus of this example is configured as shown in FIG. 3 and FIG. 4, and so designed as to irradiate the substrate surface with an infrared ray (including those having a wavelength of from 1.3 to 2.0 μm) chopped at a frequency of from 10 to 200 Hz, and to monitor the intensity of the infrared ray reflected from the substrate surface. In FIG. 3 and FIG. 4, a reference numeral 9 designates a half mirror. In the apparatus shown in FIG. 4, the vapor deposition is performed in a vacuum chamber 13 made of a material which permits the transmission of the infrared ray and the half mirror 9 and a light detecting system are provided outside the chamber 13. In this figure, a reference numeral 14 designates a connector leading to an exhausting system.

The apparatus of this example is based on a phenomenon that if the film has a large electric conductivity and a free carrier has a concentration of about $10^{20}$ cm$^{-3}$, the film strongly reflects the infrared ray, and it gradually begins to transmit the infrared ray with a decrease in the concentration of the free carrier (namely, an increase in the electric resistance of the film). According to the above-mentioned film producing process and the apparatus of this example, an output corresponding to the intensity of the infrared ray reflected from the film surface as shown in FIG. 5 is obtained by the light detecting system.

Figure 5:
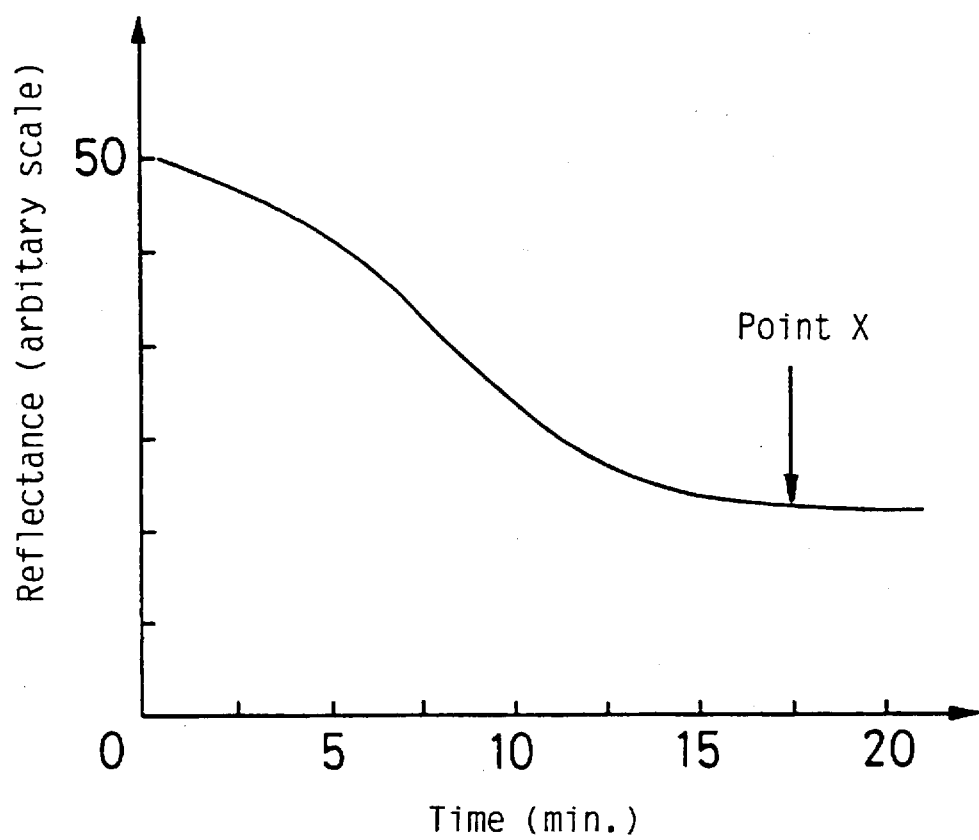
FIG. 5 is a diagram showing the changes in the light reflectance of the chalcopyrite thin film produced by the manufacturing apparatus shown in FIG. 4.

In FIG. 5, the time in its abscissa indicates a lapse of time after a time point when the supply of the flux is switched from the condition of depositing the element A-excessive film to the element B-excessive condition or when the supply of element A is stopped. A point X in the diagram represents a time point of from 5 to 15 minutes after the abrupt change in the output signal. The change in the composition of A/B ratio reflects a moderate change in the film composition to the film of element B-excessive composition.

The ABC$_2$ chalcopyrite thin film layer (wherein A=Cu, B=In, C=Se) thus obtained under a condition corresponding to the point X had an almost homogeneous composition in its entirety and was a film having the following composition: 24–25 atomic % for element A, 25–25.5 atomic % for element B and 50–50.5 atomic % for element C.

As described above, according to the apparatus having the monitoring means in accordance with the present invention, it is possible to produce the ABC$_2$ chalcopyrite (wherein, A represents Cu or Ag, B represents In, Ga or Al, C represents S, Se or Te) thin film layer 3 having an excellent quality which is most suitable for the photovoltaic devices such as solar cells and the like in a simple operation with a good reproducibility.

EXAMPLE 3

Figure 6:
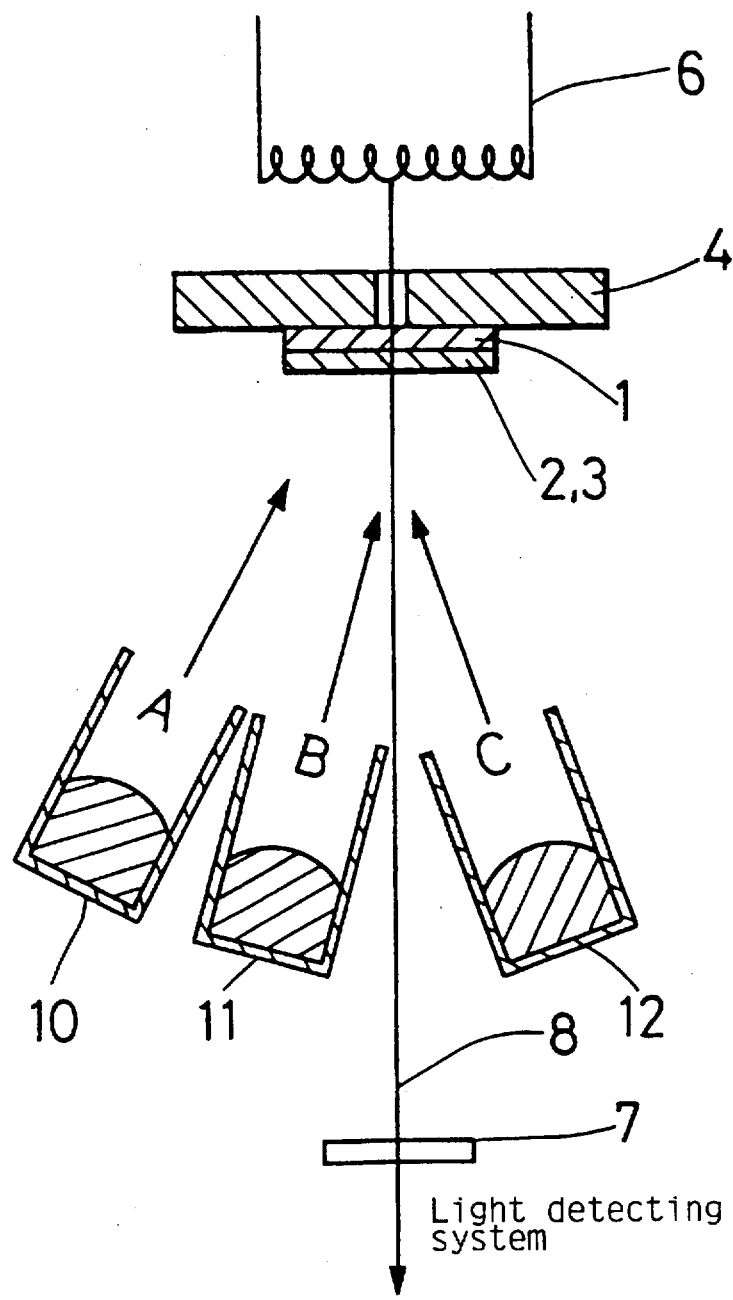
FIG. 6 is a longitudinal cross-sectional view schematically showing an apparatus for manufacturing a chalcopyrite thin film in accordance with a still further embodiment of the present invention.
Figure 7:
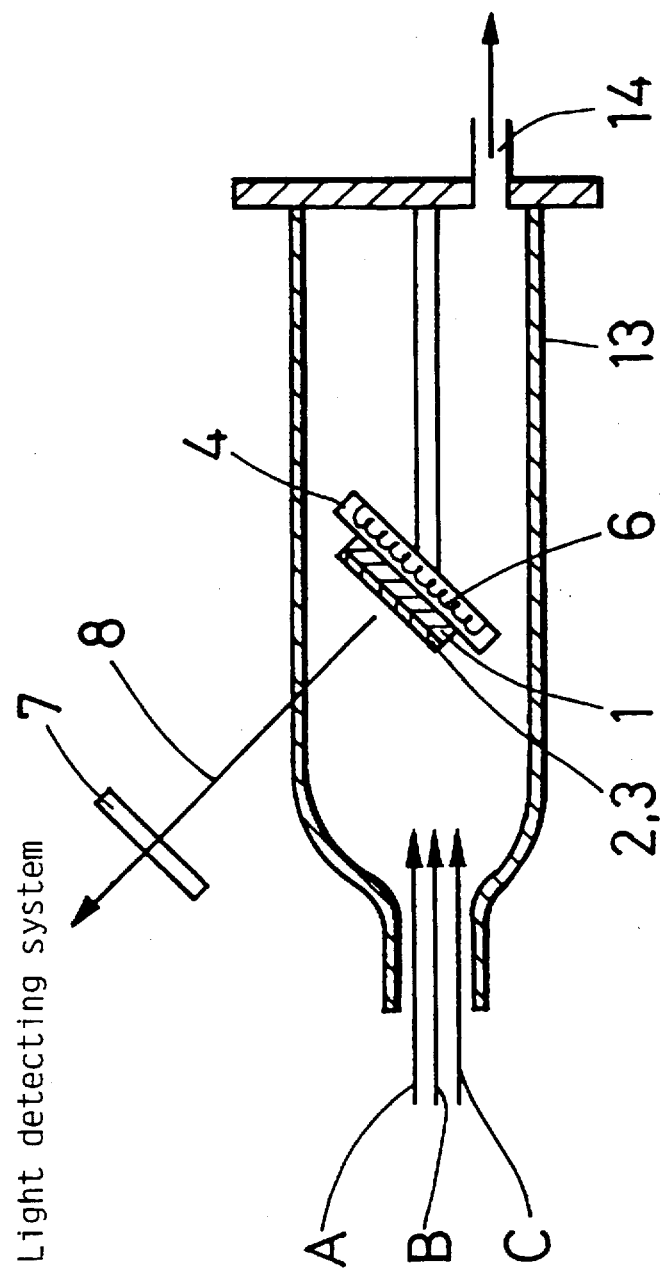
FIG. 7 is a longitudinal cross-sectional view schematically showing an apparatus for manufacturing a chalcopyrite thin film in accordance with a still another embodiment of the present invention.

FIG. 6 and FIG. 7 show a schematic configuration of an apparatus for manufacturing the ABC$_2$ chalcopyrite thin film built in accordance with this example. The manufacturing process employing the apparatus is performed in the following manner.

First, by controlling the temperatures of the respective cells 10, 11 and 12, the amounts of the fluxes (gases) of the respective elements A, B and C were adjusted. Then, an ABC$_2$ thin film 2 of the element A-excessive composition was prepared under a condition capable of depositing the ABC$_2$ thin film of the element A-excessive composition. In this example, although a glass substrate coated with Mo was used as the substrate 1, the present invention is not necessarily limited to this. Further, the apparatus of this example is provided with a heater 6 for heating the substrate 1 in such a manner that an infrared ray 8 emitted from the heater 6 can be transmitted through an opening provided on the substrate holder 4 and the light transmitting substrate 1. The temperature of the substrate is required to be at 400° C. or above and is preferably from 500° C. to 550° C. If the temperature of the substrate is too low, growth of the crystal grains cannot proceed properly. In contrast, if the temperature of the substrate is too high, an inconvenience of re-evaporation of the supplied element may be yielded.

Subsequently, depositing the film on the substrate was continued by performing a concurrent supply of element A, element B and element C adjusted to the element B-excessive composition, or by performing a supply of only element B and element C while stopping the supply of element A. If the temperature of the substrate was sufficiently high, it was possible to prepare an $ABC_2$ chalcopyrite thin film 3 having a homogeneous composition which approximated to the stoichiometric composition but contained element B in slight excess. In this case, an electric resistance of the film became high abruptly in the film composition (A/B ratio) being in the vicinity of the stoichiometric composition ratio and demonstrated stability in the $ABC_2$ chalcopyrite thin film layer having excessive element B.

The apparatus of this example is configured as shown in FIG. 6 and FIG. 7, and so designed as to introduce the infrared ray 8 (including those having a wavelength of 1.3 to 2.0 μm) emitted from the heater 6 for heating the substrate 1 to the film during depositing operation, and to monitor the intensity of the infrared ray transmitted through the substrate. In the apparatus shown in FIG. 7, the vapor deposition is performed in a vacuum chamber 13 made of a material which permits the transmission of the infrared ray, and a visible ray cutting filter 7 and a light detecting system are provided outside the chamber 13. In this figure, a reference numeral 14 designates a connector leading to an exhausting system.

Figure 8:
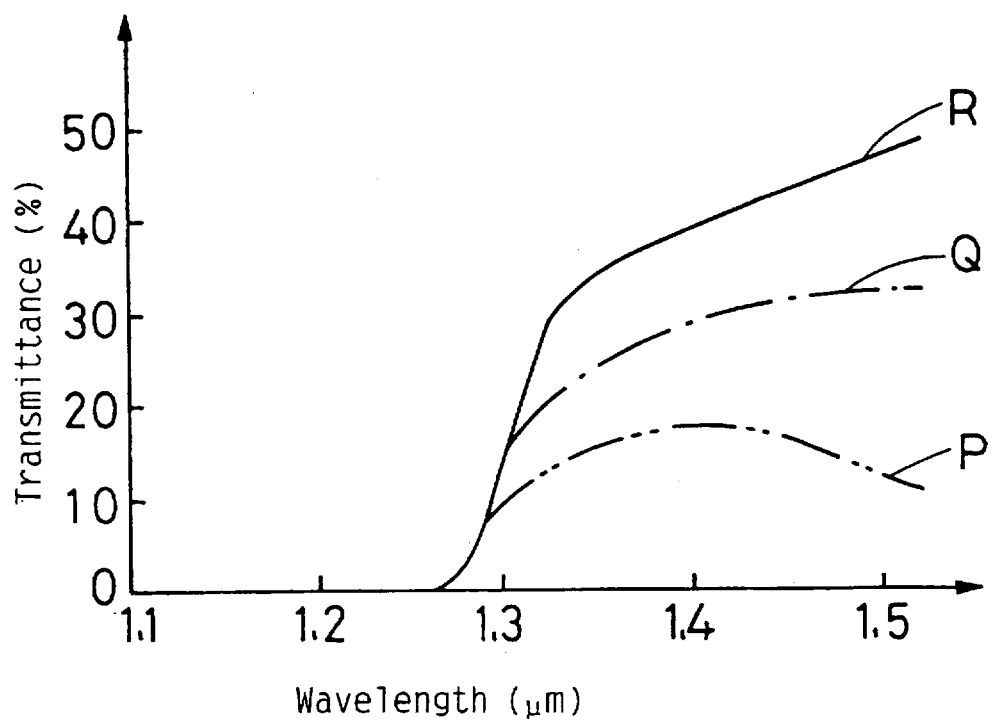
FIG. 8 is a diagram showing the near infrared ray transmittance of the chalcopyrite thin film of $CuInSe_2$.

The apparatus of this example is based on a phenomenon that if the film has a large electric conductivity and a free carrier has a concentration of about $10^{20}$ cm$^{-3}$, it strongly absorbs the infrared ray, and the film gradually begins to transmit the infrared ray with a decrease in the concentration of the free carrier (namely, an increase in the electric resistance of the film). FIG. 8 shows the near infrared ray transmittance of the $ABC_2$ thin film (wherein A=Cu, B=In, C=Se). In this diagram, each of curves P, Q and R corresponds to each of the $ABC_2$ thin films (wherein A=Cu, B=In, C=Se) having the A/B ratios of 1.8, 1.2 and 0.9, respectively. As apparent from this diagram, it is appreciated that the transmittance in the vicinity of the wavelength of 1.5 μm increases with a decrease in the A/B ratio (namely, a decrease in the electric conductivity).

Figure 9:
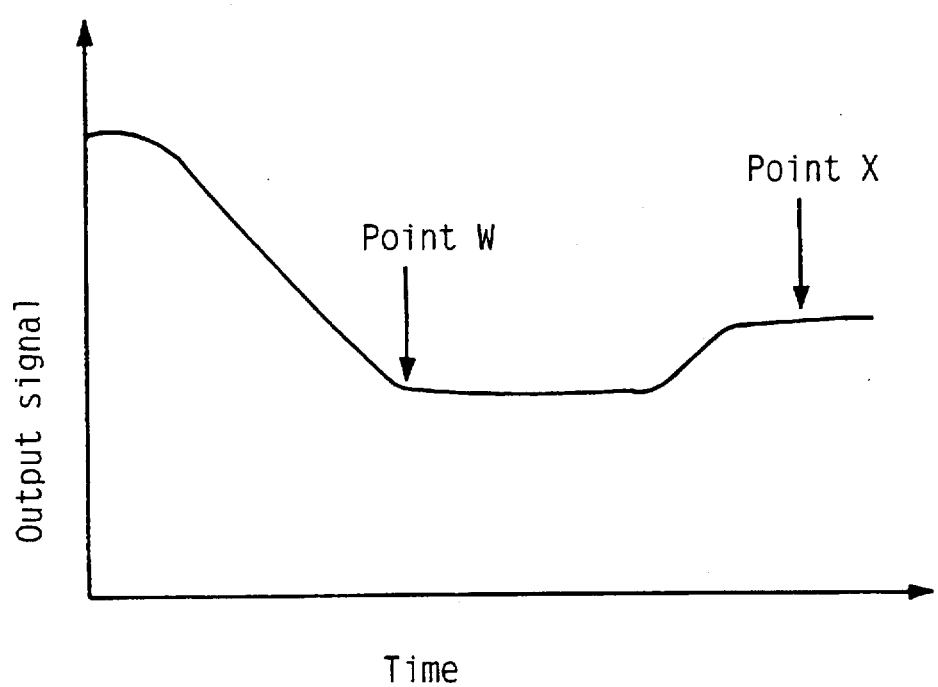
FIG. 9 is a diagram showing the value of the output signal which corresponds to the change in the transmittance of the chalcopyrite thin film in the apparatus in accordance with the present invention.
Figure 10:
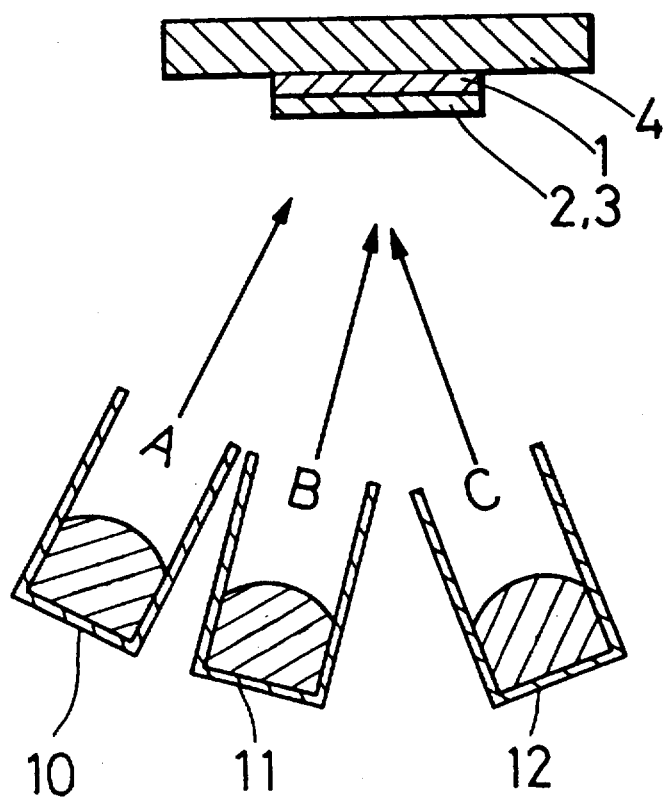
FIG. 10 is a longitudinal cross-sectional view schematically showing an apparatus for manufacturing a chalcopyrite thin film of the prior art.
Figure 11A:
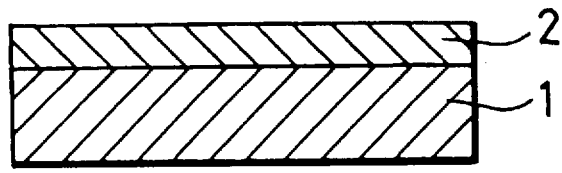
FIG. 11A, FIG. 11B and FIG. 11C are views schematically showing a manufacturing process of a chalcopyrite thin film of the prior art.
Figure 11B:
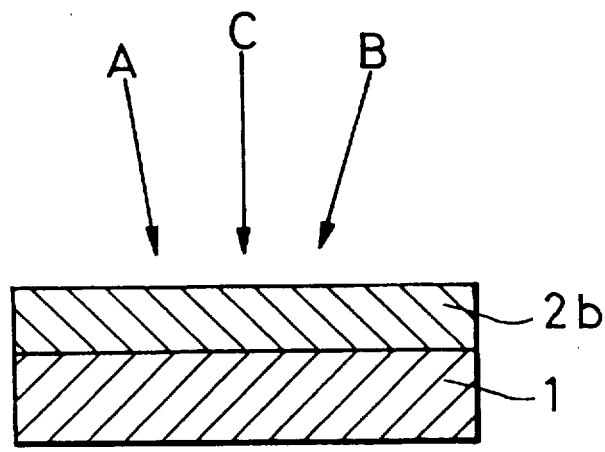
Figure 11C:
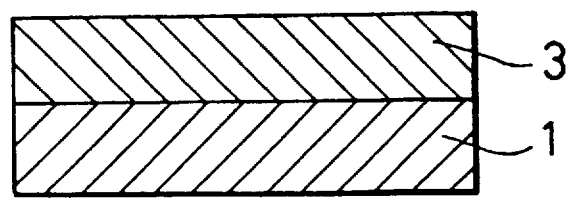

In the apparatus of this example, the optical filter 7 for cutting the visible ray is provided in order to improve a dynamic range of the observation of or the measurement relating to this phenomenon. According to the above-mentioned film producing process and the apparatus of this example, when an output signal of the light detecting system is successively monitored, a result shown by the diagram in FIG. 9 is obtained by the light detecting system.

A point W in the diagram represents the time point when the supply of the flux is switched from the condition of depositing the element A-excessive film to the element B-excessive condition or when the supply of element A is stopped. A point X in the diagram represents a time point of from 5 to 15 minutes after the value of the output signal has stabilized. Although the value of the output signal detected by this measuring system first decreases with the progress of depositing the element A-excessive $ABC_2$ thin film, a constant value of the output signal is reached after the point W wherein the condition of the flux (gas) is changed and maintained for a while. Then, the value of the output signal corresponding to the transmittance of the film increases with the change in the A/B ratio to about 1.0 by the effect shown in FIG. 8, and thereafter the value of the output signal is stabilized. An analysis on the composition of the film confirmed that the change in the A/B ratio in the composition reflected a moderate change in the film composition to the film of element B-excessive composition.

The $ABC_2$ chalcopyrite thin film layer (wherein A=Cu, B=In, C=Se) thus obtained under a condition corresponding to the point X had an almost homogeneous composition in its entirety and was a film having the following composition: 24–25 atomic % for element A, 25–25.5 atomic % for element B and 50–50.5 atomic % for element C.

As described above, according to the apparatus having the monitoring means in accordance with the present invention, it is possible to produce the $ABC_2$ chalcopyrite (wherein A represents Cu or Ag, B represents In, Ga or Al, C represents S, Se or Te) thin film layer 3 having an excellent quality which is most suitable for the photovoltaic devices such as solar cells and the like in a simple operation with a good reproducibility.

Although the present invention has been described in terms of the presently preferred embodiments, it is to be understood that such disclosures is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

What is claimed is:

1. An apparatus for manufacturing an $ABC_2$ chalcopyrite thin film layer, A representing Cu or Ag, B representing In, Ga or Al, and C representing S, Se or Te, the apparatus comprising:

a substrate holder, means provided on said substrate holder for heating a substrate;

a plurality of element supplying means, each for supplying element A, element B or element C onto said substrate and for controlling the supplying operation of the respective elements, and monitoring means for monitoring a physical property of said thin film layer deposited on said substrate, said physical property selected from the group consisting of an electrical resistance of said thin film, an intensity of light reflected from said thin film layer, and an intensity of an infrared ray transmitted through said thin film layer, wherein said physical property of said thin film layer abruptly changes at a first time point when the A/B ratio in said thin film layer changes from an element A-excessive state to the stoichiometric composition ratio of the $ABC_2$, and demonstrates a stable value at a second time point when the A/B ratio becomes an element B-excessive state, the second time point occurring after the stable value persists for a substantial time period, and wherein said monitoring is performed in order to determine an end point of depositing said thin film layer, the end point being the second time point.

2. An apparatus for manufacturing an $ABC_2$ chalcopyrite thin film layer in accordance with claim 1, wherein said substrate is electrically conductive and electrically insulated from a ground potential, the apparatus further comprising:

a load resistor connected across said substrate and the ground, and means for supplying an electron beam to a part of said substrate, said monitoring means monitoring an electrical resistance of said thin film layer by monitoring a current flowing through said load resistor.

3. An apparatus for manufacturing an $ABC_2$ chalcopyrite thin film layer in accordance with claim 1, wherein said substrate is electrically conductive and electrically insulated from a ground potential, and said monitoring means monitors an electrical resistance of said thin film layer, the monitoring means comprising a load resistor connected across said substrate and the ground, and means for supplying an electron beam to a part of said substrate, for monitoring the electrical resistance by monitoring a current flowing through said load resistor.

4. An apparatus for manufacturing an $ABC_2$ chalcopyrite thin film layer in accordance with claim 1, wherein said monitoring means monitors an intensity of light reflected from said thin film layer, the monitoring means comprising means for irradiating said substrate with light and means for detecting the intensity of light reflected from said substrate, for monitoring a reflectance of said thin film layer.

5. An apparatus for manufacturing an $ABC_2$ chalcopyrite thin film layer in accordance with claim 1, wherein said substrate permits transmission of infrared ray, said monitoring means monitors an intensity of an infrared ray transmitted through said thin film layer, the monitoring means comprising means for irradiating said substrate with infrared ray and means for detecting the intensity of infrared ray transmitted through said substrate, for monitoring a transmittance of said thin film layer.

6. An apparatus for manufacturing an $ABC_2$ chalcopyrite thin film layer in accordance with claim 5, wherein said means for irradiating said substrate with infrared ray is said means for heating said substrate.

7. An apparatus for manufacturing an $ABC_2$ chalcopyrite thin film layer in accordance with claim 5, wherein said means for detecting the intensity of infrared ray includes an optical filter for cutting visible rays impinging on its infrared ray incident side.

* * * * *